(12) United States Patent
Okabe et al.

(10) Patent No.: US 11,800,738 B2
(45) Date of Patent: Oct. 24, 2023

(54) DISPLAY DEVICE, METHOD OF MANUFACTURING DISPLAY DEVICE, APPARATUS FOR MANUFACTURING A DISPLAY DEVICE

(71) Applicant: SHARP KABUSHIKI KAISHA, Sakai (JP)

(72) Inventors: Tohru Okabe, Sakai (JP); Shinsuke Saida, Sakai (JP); Hiroki Taniyama, Sakai (JP); Shinji Ichikawa, Sakai (JP); Ryosuke Gunji, Sakai (JP); Yoshihiro Nakada, Yonago (JP); Akira Inoue, Yonago (JP); Hiroharu Jinmura, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 239 days.

(21) Appl. No.: 16/961,445

(22) PCT Filed: Jan. 18, 2018

(86) PCT No.: PCT/JP2018/001421
§ 371 (c)(1),
(2) Date: Jul. 10, 2020

(87) PCT Pub. No.: WO2019/142294
PCT Pub. Date: Jul. 25, 2019

(65) Prior Publication Data
US 2021/0083226 A1    Mar. 18, 2021

(51) Int. Cl.
*H10K 50/844* (2023.01)
*H10K 50/842* (2023.01)
*H10K 71/00* (2023.01)

(52) U.S. Cl.
CPC ....... *H10K 50/844* (2023.02); *H10K 50/8428* (2023.02); *H10K 71/00* (2023.02)

(58) Field of Classification Search
CPC .......... H01L 27/3272; H01L 2227/323; H01L 51/3258; H01L 51/52; H01L 27/3259;
(Continued)

(56) References Cited

U.S. PATENT DOCUMENTS

2015/0185539 A1    7/2015  Senokuchi et al.
2016/0079564 A1*   3/2016  Shim .................. H01L 27/3258
                                                 257/40
(Continued)

FOREIGN PATENT DOCUMENTS

JP    2011233341 A    11/2011
WO    2014/024455 A1   2/2014

*Primary Examiner* — Yu-Hsi D Sun
(74) *Attorney, Agent, or Firm* — ScienBiziP, P.C.

(57) ABSTRACT

The disclosure has an object to achieve a high level of height precision for spacers on a back plane. A display device includes: edge covers having a plurality of openings in which first electrodes are exposed; and a planarization film having first flat portions, second flat portions, and contact holes. The plurality of openings respectively overlap the first flat portions in a plan view. The second flat portions are located between the plurality of openings in a plan view. Each edge cover overlapping one of the first flat portions in a plan view has, on a second electrode side, a surface that has a first height from a bottom surface of the planarization film on a substrate side. Each second flat portion has, on the second electrode side, a surface that has a second height from the bottom surface. The first height is smaller than the second height.

13 Claims, 14 Drawing Sheets

(58) Field of Classification Search
CPC ............... H01L 27/3258; H01L 51/525; H01L 51/5253; G09F 9/30; G09F 9/00; H10K 59/122
See application file for complete search history.

(56) References Cited

U.S. PATENT DOCUMENTS

| 2016/0204373 | A1* | 7/2016 | Park | ................... H01L 51/5253 257/40 |
| 2017/0031323 | A1* | 2/2017 | Kim | ................... H01L 27/3258 |
| 2017/0117502 | A1* | 4/2017 | Park | ....................... H01L 51/56 |
| 2019/0148469 | A1* | 5/2019 | Lhee | ................... H01L 27/3279 257/40 |
| 2022/0005911 | A1* | 1/2022 | Zhou | ................... H10K 59/131 |

* cited by examiner

DISPLAY DEVICE, METHOD OF MANUFACTURING DISPLAY DEVICE, APPARATUS FOR MANUFACTURING A DISPLAY DEVICE

TECHNICAL FIELD

The disclosure relates to display devices including light-emitting elements.

BACKGROUND ART

PCT International Application Publication No. WO2014-24455 (Publication Date: Feb. 13, 2014) discloses a display panel including spacers on the back plane. The spacers are used to control the distance separating a bottom substrate and an opposite substrate and/or used as photo spacers that come into contact with a vapor-deposition mask used in forming a layered structure of the display device.

CITATION LIST

Patent Literature

Patent Literature 1
PCT International Application Publication No. WO2014-24455 (Publication Date: Feb. 13, 2014)

SUMMARY OF DISCLOSURE

The spacers on the back plane of a display device are in some cases formed by photolithography using a grayscale mask such as a halftone mask or a gray tone mask in order to form both the spacers and other structural elements in the same layer in a single photolithography process. The use of a grayscale mask in forming the spacers may, however, cause thermal sagging of the photosensitive material in the baking step that follows washing in the photolithography process.

If the photosensitive material that may thermally sag has a large volume or if the photosensitive material has openings close to the spacers, the spacers will experience relatively extensive thermal sagging and may end up having top faces with greatly variable heights. That can present difficulties in achieving a high level of height precision for spacers in the photolithography process using a grayscale mask.

Solution to Problem

To address these problems, the present application is directed to a display device including a planarization film, first electrodes, edge covers, light-emitting layers, and second electrodes that are arranged in this order when viewed from a substrate side and further including: a display area; a plurality of pixels forming the display area; and a plurality of openings in the edge covers, the first electrodes being exposed in the plurality of openings, wherein the planarization film has first flat portions, second flat portions, and contact holes, the plurality of openings respectively overlap the first flat portions, the second flat portions are located between the plurality of openings, and each edge cover overlapping one of the first flat portions has, on a second electrode side, a surface that has a first height from a bottom surface of the planarization film on the substrate side, and each second flat portion has, on the second electrode side, a surface that has a second height from the bottom surface, the first height being smaller than the second height.

To address these problems, the present application is directed also to a method of manufacturing a display device including a planarization film, first electrodes, edge covers, light-emitting layers, and second electrodes that are arranged in this order when viewed from a substrate side and further including: a display area; a plurality of pixels forming the display area; and a plurality of openings in the edge covers, the first electrodes being exposed in the plurality of openings, the method including the planarization film forming step of forming the planarization film by photolithography using a grayscale mask and involving a single exposure, wherein the planarization film forming step forms: first flat portions respectively overlapping the plurality of openings; second flat portions between the plurality of openings; and contact holes, to form the planarization film in such a manner that each edge cover overlapping one of the first flat portions has, on a second electrode side, a surface that has a first height from a bottom surface of the planarization film on the substrate side and that each second flat portion has, on the second electrode side, a surface that has a second height from the bottom surface, the first height being smaller than the second height.

To address these problems, the present application is directed also to an apparatus for manufacturing a display device including a planarization film, first electrodes, edge covers, light-emitting layers, and second electrodes that are arranged in this order when viewed from a substrate side and further including: a display area; a plurality of pixels forming the display area; and a plurality of openings in the edge covers, the first electrodes being exposed in the plurality of openings, the apparatus including a film-forming machine that forms, in forming the planarization film: first flat portions respectively overlapping the plurality of openings; second flat portions between the plurality of openings; and contact holes, all by photolithography using a grayscale mask and involving a single exposure, in such a manner that each edge cover overlapping one of the first flat portions has, on a second electrode side, a surface that has a first height from a bottom surface of the planarization film on the substrate side and that each second flat portion has, on the second electrode side, a surface that has a second height from the bottom surface, the first height being smaller than the second height.

Advantageous Effects of Invention

Any of these arrangements enables achieving an improved level of height precision for spacers made of a photosensitive material that may thermally sag while still employing photolithography using a grayscale mask, thereby enabling manufacturing display devices with an improved yield.

DESCRIPTION OF EMBODIMENTS

Embodiment 1

Throughout the following description, the expressions like "component A is in the same layer as component B" indicate that components A and B are formed of the same material in the same process or step, the expressions like "component A underlies/is below component B" indicate that component A is formed in an earlier process or step than component B, and the expressions like "component A overlies/is above component B" indicate that component A is formed in a later process or step than component B. The upward direction, throughout the present specification, is defined as the direction from an underlying layer toward an overlying layer in the display device.

Figure 1:
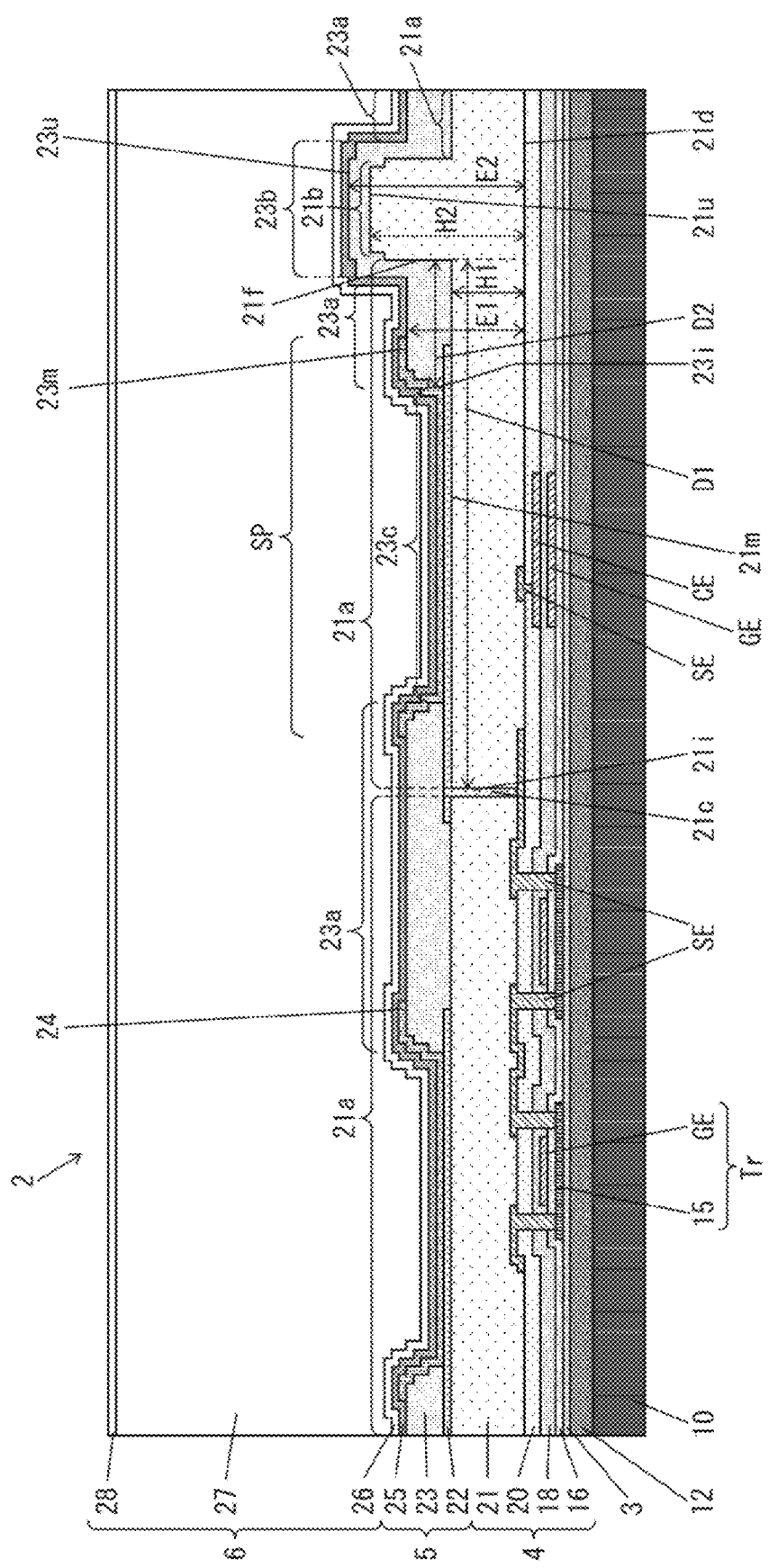
FIG. 1 is a cross-sectional view of a display area of a display device in accordance with Embodiment 1.
Figure 2:
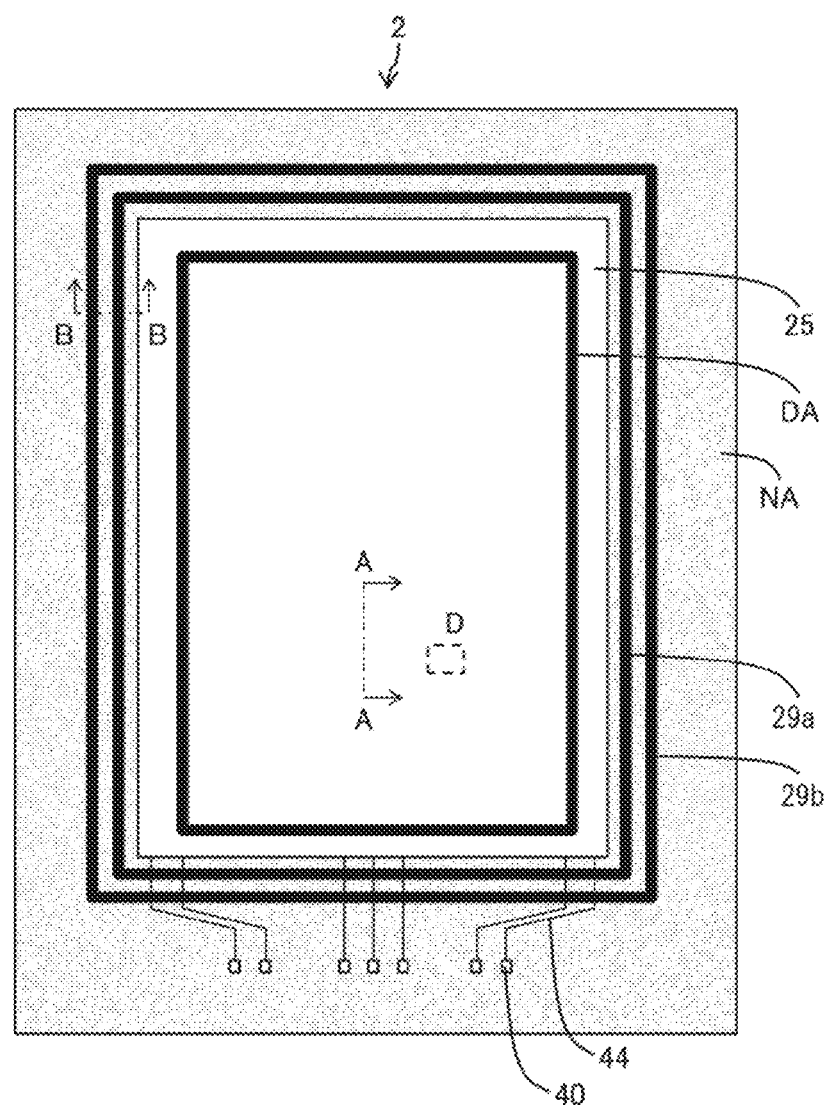
FIG. 2 is a top view of the display device in accordance with Embodiment 1.
Figure 4:
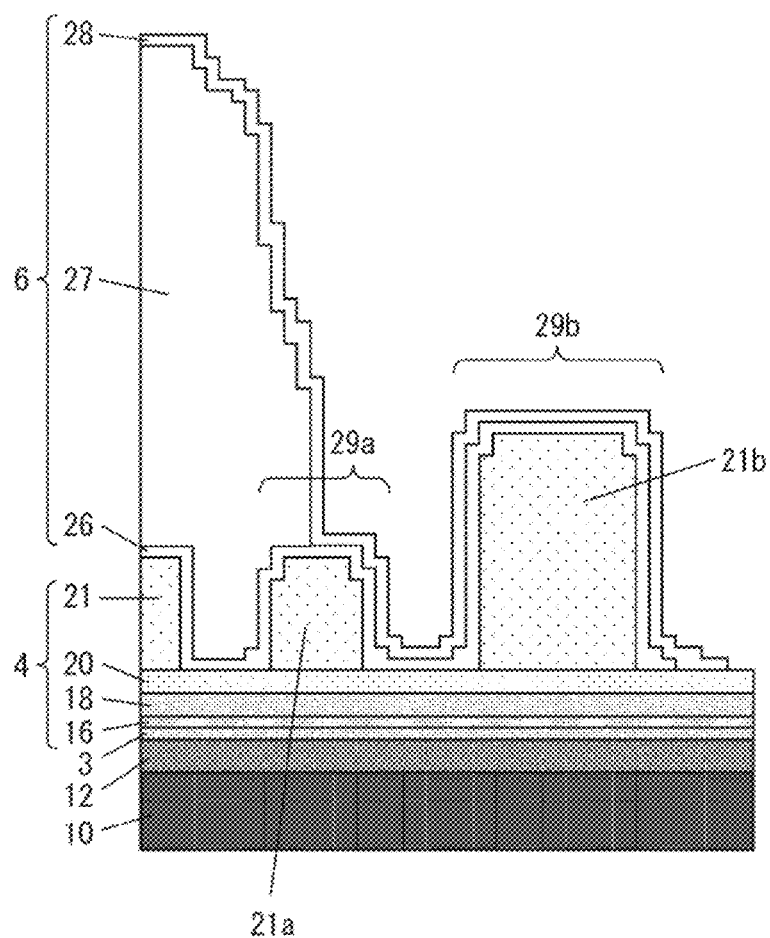
FIG. 4 is a cross-sectional view of a first bank, a second bank, and their surroundings in a frame area of the display device in accordance with Embodiment 1.

FIG. 2 is a top view of a display device 2 in accordance with the present embodiment. FIG. 1 is a cross-sectional view taken along line AA shown in FIG. 2. FIG. 4 is a cross-sectional view taken along line BB shown in FIG. 2.

The display device 2 in accordance with the present embodiment has a display area DA and a frame area NA that is adjacent to the periphery of the display area DA, as shown in FIG. 2. A detailed description is now given of the display device 2 in accordance with the present embodiment with reference to FIG. 1.

Referring to FIG. 1, the display device 2 in accordance with the present embodiment includes a support substrate 10, a resin layer 12, a barrier layer 3, a TFT layer 4, a light-emitting element layer 5, and a sealing layer 6 that are arranged in this order when viewed from below. On top of the sealing layer 6, the display device 2 may further include a functional film having, among others, an optical compensation function, a touch sensor function, and a protection function.

The support substrate 10 may be, for example, a glass substrate. The resin layer 12 may be made of, for example, polyimide.

The barrier layer 3 prevents foreign objects such as water and oxygen from reaching the TFT layer 4 and the light-emitting element layer 5 while the display device is in use. The barrier layer 3 may include, for example, a silicon oxide film, a silicon nitride film, a silicon oxynitride film, or a stack of these films. These films can be formed by CVD.

The TFT layer 4 includes: a semiconductor layer 15, a first inorganic layer 16 (gate insulating film), a gate electrode GE, a second inorganic layer 18, a capacitor electrode CE, a third inorganic layer 20, a source line SH (metal wiring layer), and a planarization film 21 (interlayer insulating film) that are arranged in this order when viewed from below. A thin layer transistor (TFT) Tr is structured to include the semiconductor layer 15, the first inorganic layer 16, and the gate electrode GE.

The semiconductor layer 15 is made of, for example, a low-temperature polysilicon (LTPS) or an oxide semiconductor. FIG. 2 shows a top-gate TFT where the semiconductor layer 15 serves as a channel. The TFT may alternatively have a bottom-gate structure (for example, when the TFT has an oxide semiconductor channel).

The gate electrode GE, the capacitor electrode CE, or the source line SH may contain, for example, at least one of aluminum (Al), tungsten (W), molybdenum (Mo), tantalum (Ta), chromium (Cr), titanium (Ti), and copper (Cu). The gate electrode GE, the capacitor electrode CE, or the source line SH is made of a monolayer film of one of these metals or a stack of films of (some of) these metals. Specifically, in the present embodiment, the gate electrode GE contains Mo, and the source line SH contains Al.

The first inorganic layer 16, the second inorganic layer 18, and the third inorganic layer 20 are made of a silicon oxide (SiOx) film or a silicon nitride (SiNx) film formed by, for example, CVD or a stack of such films. The planarization film 21 may be made of, for example, a photosensitive organic material, such as polyimide or acrylic, that can be provided by coating.

In the display device 2 in accordance with the present embodiment, the planarization film 21 has a first flat portion 21a, a second flat portion 21b, and a contact hole 21c. The first flat portion 21a and the second flat portion 21b have respective heights H1 and H2 that are distances from a bottom surface 21d of the planarization film 21 facing the support substrate 10 to surfaces 21m and 21u thereof facing the light-emitting element layer 5. Height H1 is smaller than height H2. The contact hole 21c is open in the first flat portion 21a.

The "flat portions," in the present specification, refer to regions of different heights and may not strictly flat. As an example, either the first flat portion 21a or the second flat portion 21b may be partially gently convex or concave, in which case the height defined above is a distance from the bottom surface to the highest point of the surface of the planarization film 21 facing the light-emitting element layer 5.

The light-emitting element layer 5 (e.g., organic light-emitting diode layer) includes a pixel electrode 22 (a first electrode, for example, an anode), a cover film (edge cover) 23, a light-emitting layer 24, and an upper electrode (a second electrode, for example, a cathode) 25 that are arranged in this order when viewed from below. The cover film 23 covers the edges of the pixel electrode 22. The light-emitting element layer 5 includes, for each subpixel SP (pixel): a light-emitting element (e.g., an OLED or an organic light-emitting diode) including the insular pixel electrode 22, the insular light-emitting layer 24, and the upper electrode 25; and a subpixel circuit for driving the light-emitting element.

The pixel electrode 22 is disposed so as to overlap the first flat portion 21a and the contact hole 21c of the planarization film 21 in a plan view. The pixel electrode 22 is electrically connected to the source line SH via the contact hole 21c. Signals are hence supplied from the TFT layer 4 to the pixel electrode 22 via the source line SH. The pixel electrode 22 may have a thickness of, for example, 100 nm.

The cover film 23 is an organic insulating film and formed by patterning an applied photosensitive organic material such as polyimide or acrylic by photolithography. The cover film 23 includes: a first cover-film flat portion 23a overlapping the first flat portion 21a in a plan view; a second cover-film flat portion 23b overlapping the second flat portion 21b in a plan view; and an opening 23c in the first cover-film flat portion 23a.

The cover film 23 is provided so as to cover the edges of the pixel electrode 22. The opening 23c is provided for each group of subpixels SP. The pixel electrode 22 is partly exposed. Each opening 23c overlaps the first flat portion 21a in a plan view. The second flat portion 21b is formed between the openings 23c.

Figure 3:
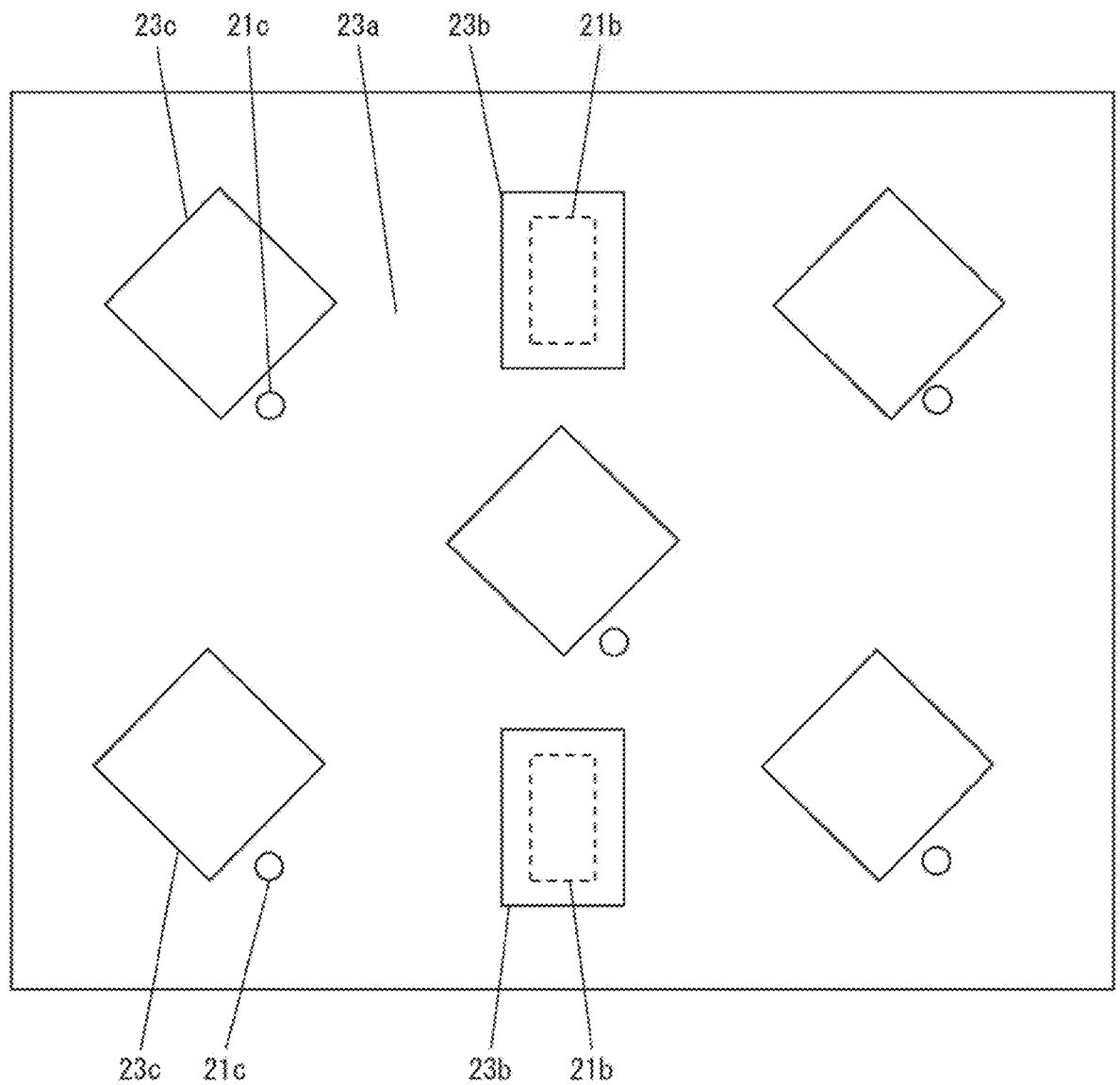
FIG. 3 is a top view illustrating a positional relationship between a planarization film and a cover film in the display device in accordance with Embodiment 1.

FIG. 3 is an enlarged top view of region D shown in FIG. 2, illustrating a positional relationship between the planarization film 21 and the cover film 23 in the present embodiment. For convenience of description, FIG. 3 shows the display device 2 by removing the sealing layer 6, the upper electrode 25, and the light-emitting layer 24 that are arranged in this order when viewed from above. Similarly, FIG. 3 indicates the second flat portion 21b by a dotted line by removing the second cover-film flat portion 23b overlapping the second flat portion 21b in a plan view. FIG. 3 shows the contact hole 21c by removing the layers above the contact hole 21c where the contact hole 21c is not directly visible from above in a plan view.

The first cover-film flat portion 23a and the second cover-film flat portion 23b have respective heights E1 and E2 that are distances from the bottom surface 21d of the planarization film 21 facing the support substrate 10 to surfaces 23m and 23u thereof facing the light-emitting element layer 5. Height E1 is smaller than height E2, and height E1 is smaller than height H2. The cover film 23 needs only to have such a thickness as to cover the edges of the pixel electrode 22, and the cover film 23 may have a thickness of less than or equal to 1 µm.

As shown in FIG. 1, around the second flat portion 21b, the cover film 23, with a height close to height E2, is provided also in locations above the first flat portion 21a in a plan view. In the present embodiment, the cover film 23 is regarded equivalent to the second cover-film flat portion 23b in locations having a height close to height E2 around the second flat portion 21b even if the locations are above the first flat portion 21a in a plan view.

D1 denotes the distance between an outer face 21f of the second flat portion 21b as viewed from the center of the second flat portion 21b and an inner face 21i of the contact hole 21c that is closest to the outer face 21f as viewed from the center of the contact hole 21c, as shown in FIG. 1. D2 denotes the distance between the outer face 21f and an inner face 23i of the opening 23c that is closest to the outer face 21f as viewed from the center of the opening 23c. D1 is greater than D2 in the present embodiment. In other words, the second flat portion 21b is located closer to the closest opening 23c than to the closest contact hole 21c.

The light-emitting layer 24 includes, for example, a stack of a hole transport layer, a light-emitting layer, and an electron transport layer that are arranged in this order when viewed from below. An insular light-emitting layer is formed for each subpixel SP by vapor deposition or inkjet technology. A hole transport layer and an electron transport layer may be formed with an insular shape for each subpixel SP or provided as a common layer for all the subpixels SP.

The pixel electrode 22 is insular and provided for each group of subpixels SP. The pixel electrode 22 includes, for example, a stack of ITO (indium tin oxide) and a Ag-containing alloy and is light-reflective. The upper electrode 25 is provided as a common layer for all the subpixels SP and may be made of a transparent conductive material such as ITO (indium tin oxide) and IZO (indium zinc oxide).

If the light-emitting element layer 5 is an OLED layer, holes and electrons recombine in the light-emitting layer 24 due to the drive current flowing between the pixel electrode 22 and the upper electrode 25, to produce excitons that fall to the ground state to emit light. Since the upper electrode 25 is transparent, and the pixel electrode 22 is light-reflective, the light emitted by the light-emitting layer 24 travels upward, thereby achieving "top mission."

The sealing layer 6 includes: a first inorganic sealing film 26 overlying the upper electrode 25; an organic sealing film 27 overlying the first inorganic sealing film 26; and a second inorganic sealing film 28 overlying the organic sealing film 27. The sealing layer 6 prevents foreign objects such as water and oxygen from reaching the light-emitting element layer 5. Each of the first inorganic sealing film 26 and the second inorganic sealing film 28 may be a silicon oxide film, a silicon nitride film, or a silicon oxynitride film, formed by, for example, CVD, or a stack of these films. The organic sealing film 27 may be made of a photosensitive organic material, such as polyimide or acrylic, that can be provided by coating.

FIG. 4 is a cross-sectional view taken along line BB shown in FIG. 2, showing a bank and its proximity in the frame area NA adjacent to the periphery of the display area DA of the display device 2 in accordance with the present embodiment. Referring to FIGS. 2 and 4, the display device 2 includes a first bank 29a, a second bank 29b, and a terminal section 40 in the frame area NA.

The first bank 29a is shaped like a frame and provided so as to surround the upper electrode 25. The second bank 29b is shaped like a frame and provided so as to surround the first bank 29a. The first bank 29a includes: the first flat portion 21a of the planarization film 21; the second bank 29b; and the second flat portion 21b of the planarization film 21. The second bank 29b therefore has a greater height than the first bank 29a. The first bank 29a and the second bank 29b prevent the organic sealing film 27 in the overlying sealing layer 6 from wet-spreading when the organic sealing film 27 is provided by coating. For instance, in FIG. 4, the first bank 29a abuts an end of the organic sealing film 27 to stop the wet-spreading of the organic sealing film 27.

The terminal section 40 is provided around a second bank 29b. For example, a driver (not shown) to which signals are supplied via routing lines 44 to drive the light-emitting elements in the display area DA is mounted to the terminal section 40.

Figure 5:
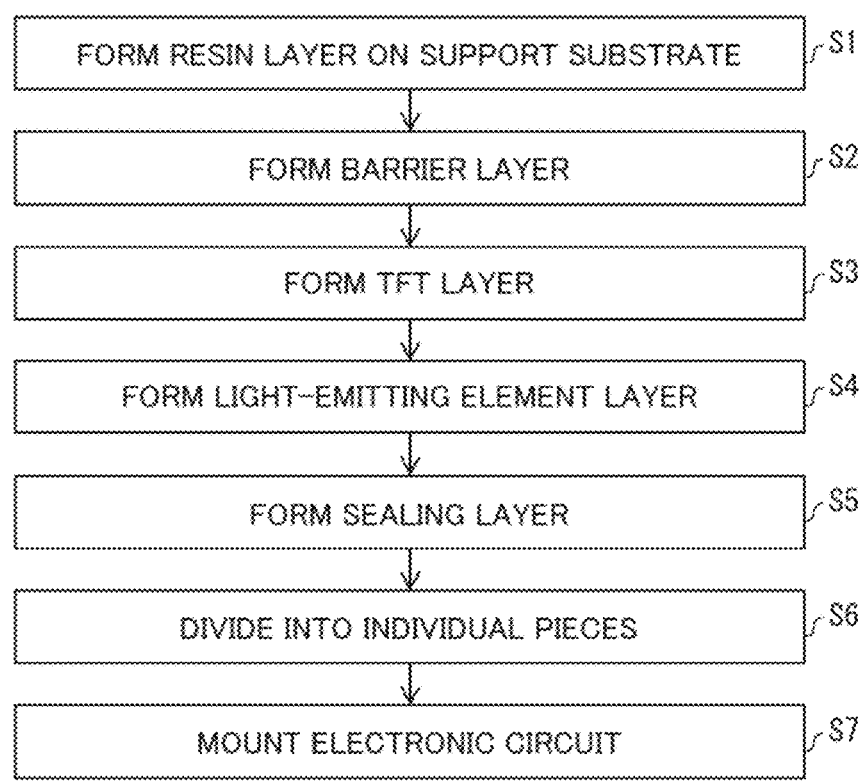
FIG. 5 is a flow chart representing a method of manufacturing a display device in accordance with Embodiment 1.
Figure 6:
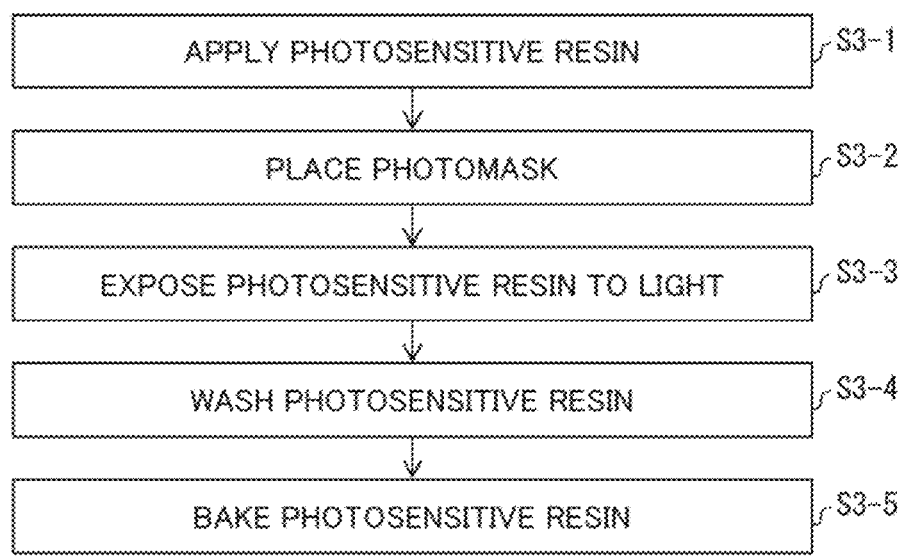
FIG. 6 is a flow chart representing the formation of a planarization film in further detail in the method of manufacturing a display device in accordance with Embodiment 1.

A detailed description is now given of a method of manufacturing the display device 2 in accordance with the present embodiment with reference to flow charts in FIGS. 5 and 6.

First, the resin layer 12 is formed on a transparent support substrate 10 (e.g., a mother glass substrate) (step S1). Next, the barrier layer 3 is formed on the resin layer 12 (step S2).

Figure 7:
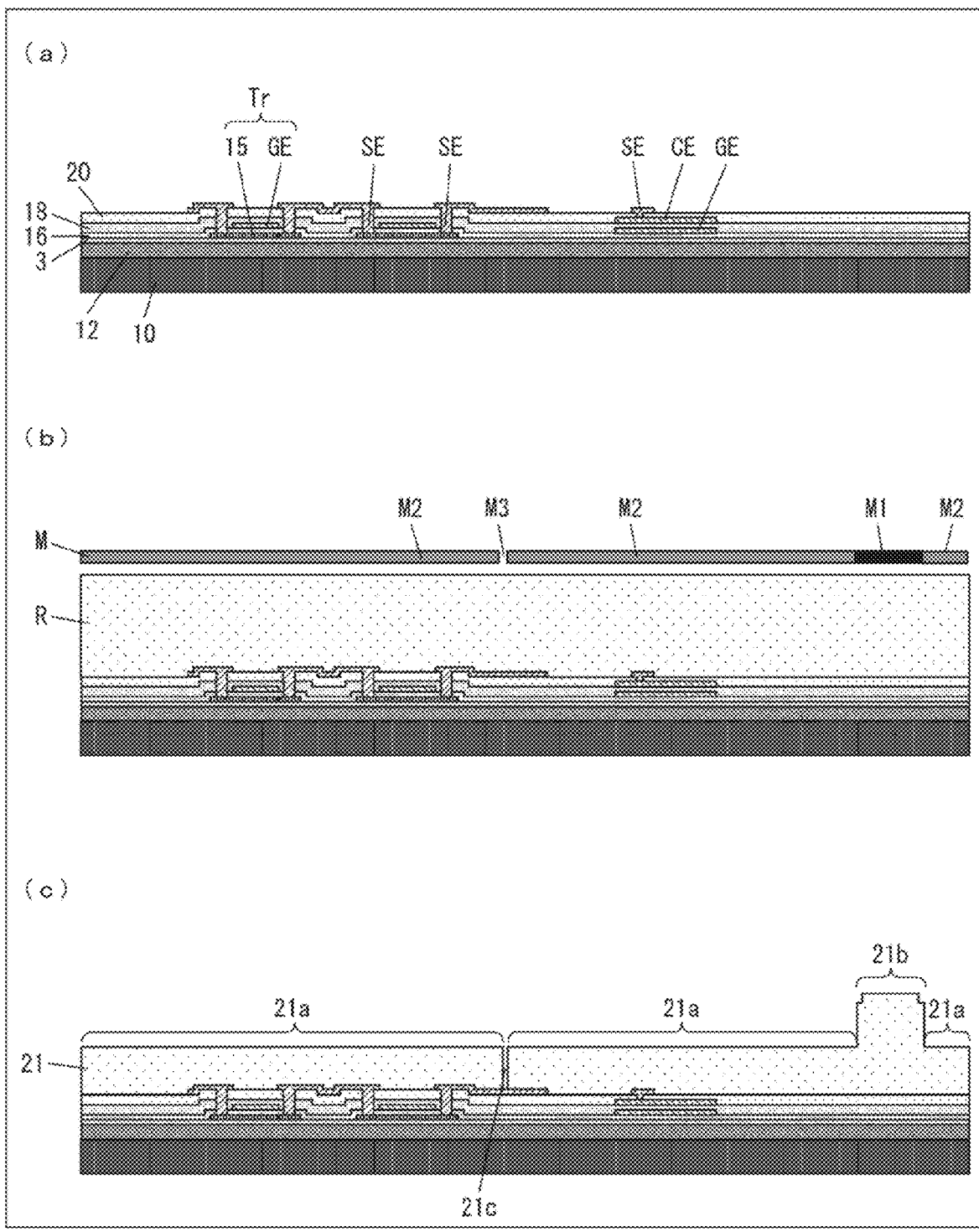
FIG. 7 is a set of cross-sectional step views illustrating the method of manufacturing a display device in accordance with Embodiment 1.
Figure 8:
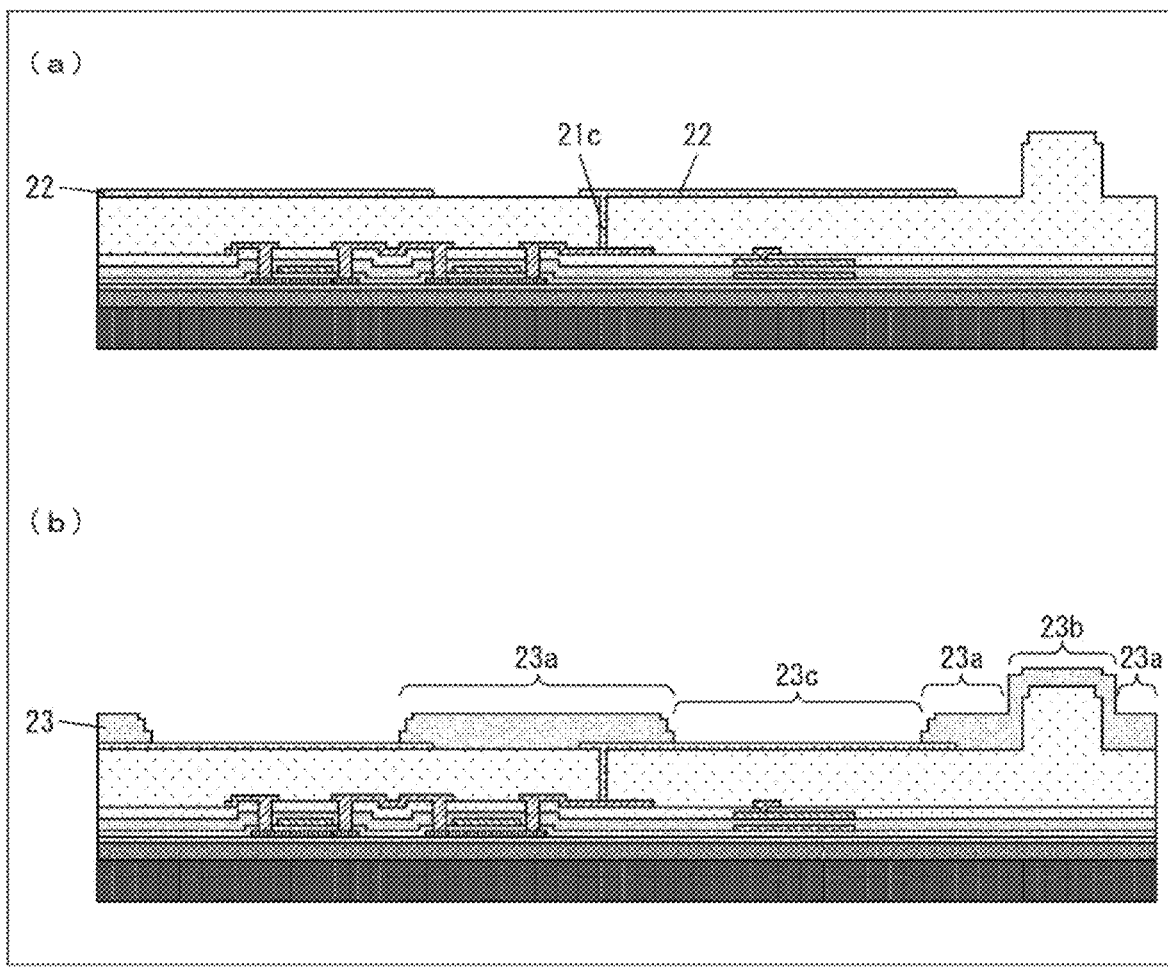
FIG. 8 is another set of cross-sectional step views illustrating the method of manufacturing a display device in accordance with Embodiment 1.
Figure 9:
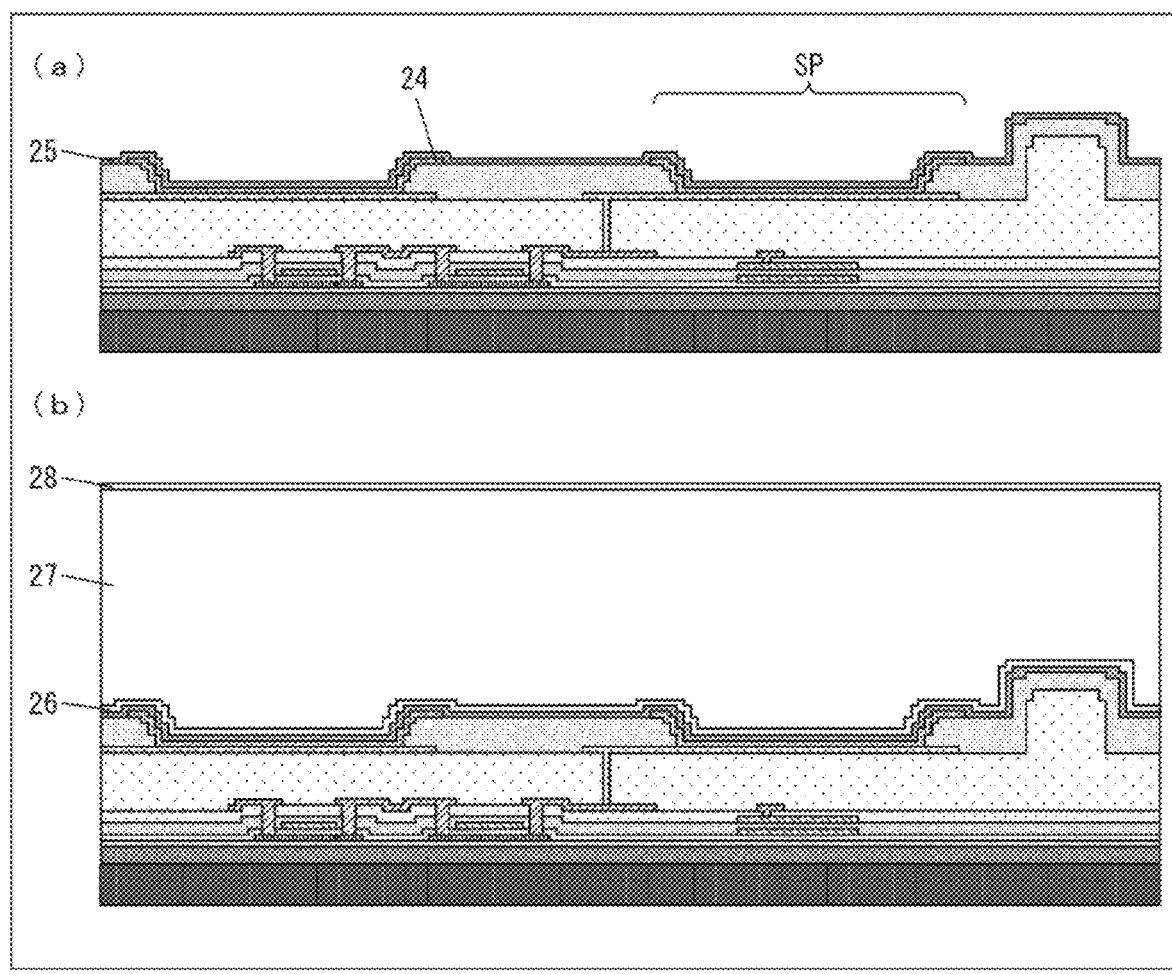
FIG. 9 is a further set of cross-sectional step views illustrating the method of manufacturing a display device in accordance with Embodiment 1.

Next, the TFT layer 4 is formed on the barrier layer 3 (step S3). A detailed description is given of the formation of the TFT layer 4, particularly the formation of the planarization film 21, in step S3 with additional reference to cross-sectional step views in FIGS. 7 to 9. FIGS. 7 to 9 illuminate a configuration in a location corresponding to FIG. 1 in step S3.

In step S3, first, the semiconductor layer 15, the first inorganic layer 6, the gate electrode GE, the second inorganic layer 18, the capacitor line CE, the third inorganic layer 20, and the source line SH are formed on the barrier layer 3 in this order when viewed from below. These layers can be formed by a publicly known, conventional method. The film-forming steps so far result in the structure shown in (a) of FIG. 7.

Next, as shown in (b) of FIG. 7, a photosensitive resin R is provided by coating from above the third inorganic layer 20 and the source line SH (step S3-1). The photosensitive resin R may be, for example, a positive photosensitive resin. Next, a photomask M shown in (b) of FIG. 7 is placed above the photosensitive resin R (step S3-2). The photomask M is a grayscale mask and may be, for example, a halftone mask including a light-blocking section M1, a semi-light-transmitting section M2, and a light-transmitting section M3. The light-blocking section M1 is less transparent to light than the light-transmitting section M3. The semi-light-transmitting section M2 is more transparent to light than the light-blocking section M1 and less transparent to light than the light-transmitting section M3.

Next, light is shone from above the photomask M to expose the photosensitive resin R to light (step S3-3). Next, the exposed photosensitive resin R is washed in a suitable light-exposure liquid (step S3-4).

In the present embodiment, the photosensitive resin R is not exposed to sufficient tight to be dissolved in the light-exposure liquid in locations corresponding to the light-blocking sections M1. Therefore, the photosensitive resin R remains and forms a relatively thick layer in those locations in those locations. In contrast, in locations corresponding to the light-transmitting sections M3, the photosensitive resin R is exposed to sufficient light to be dissolved in the light-exposure liquid 3. Therefore, there are formed openings in the photosensitive resin R. Furthermore, in the locations corresponding to the light-transmitting sections M3, the photosensitive resin R is partly exposed to light and thus partly dissolved in the light-exposure liquid. The photosensitive resin R therefore remains and forms a thinner layer in those locations than in the locations corresponding to the light-blocking sections M1.

Next, the washed photosensitive resin R is baked (step S3-5). The planarization film 21 shown in (c) of FIG. 7 is hence obtained by photolithography involving a single exposure. Specifically, the first flat portion 21a is formed in locations corresponding to the semi-light-transmitting sections M2, the second flat portion 21b is formed in the locations corresponding to the light-blocking sections M1, and the contact holes 21c are formed in the locations corresponding to the light-transmitting sections M3. Steps S3-1 to S3-5 may be performed also in the frame area NA to form the first flat portion 21a in locations corresponding to the first bank 29a in the frame area NA shown in FIG. 4 and form the second flat portion 21b in locations corresponding to the second bank 29b in the frame area NA.

Next, the top-mission, light-emitting element layer (e.g., OLED layer) 5 is formed (step S4). The pixel electrodes 22 are formed first in locations including the contact holes 21c as shown in (b) of FIG. 8. The cover film 23 shown in (b) of FIG. 8 is then obtained by photolithography involving a single exposure using a photomask having only two transmittances, for example, a photomask having only light-blocking sections and light-transmitting sections. This cover film 23 is formed in such locations as to cover the edges of the pixel electrodes 22.

Next, the light-emitting layer 24 and the upper electrode 25 are formed to form the light-emitting element layer 5 and the subpixels SP as shown in (a) of FIG. 9. If the light-emitting layer 24 is formed by vapor-depositing an organic material using a metal mask, the second cover-film flat portion 23b may be used as a photo spacer abutted by the metal mask. This arrangement prevents the metal mask from abutting the layers in the subpixels SP, thereby reducing defects.

Next, the sealing layer 6 shown in (b) of FIG. 9 is formed (step S5). The first bank 29a and the second bank 29b prevent the organic sealing film 27 in the sealing layer 6 from wet-spreading in the formation of the organic sealing film 27.

Next, the stack of the support substrate 10, the resin layer 12, the barrier layer 3, the TFT layer 4, the light-emitting element layer 5, and the sealing layer 6 is divided to obtain a plurality of individual pieces (step S6). Next, an electronic circuit board (e.g., IC chip) is mounted to the terminal section 40 to form the display device 2 (step S7).

The present embodiment has described a method of manufacturing the display device 2 by assuming that the support substrate 10 is rigid. Alternatively, the present embodiment becomes applicable to the manufacture of a flexible display device 2 by adding some steps. For instance, subsequent to step S5, the bottom surface of the resin layer 12 is irradiated with a laser beam via the support substrate 10 to reduce the binding between the support substrate 10 and the resin layer 12 so that the resin layer 12 can be detached from the support substrate 10. Next, a bottom surface film is attached to the bottom surface of the resin layer 12. The process then proceeds to step S6 and subsequent steps to finally obtain a flexible display device 2.

In the display device 2 in accordance with the present embodiment, the second flat portion 21b is formed in the formation of the planarization film 21, by photolithography using a grayscale mask in order to form the second cover-film flat portion 23b used as spacers such as photo spacers.

The present method can therefore reduce the volume of the thermally sagging photosensitive material in the baking step of photolithography when compared with a method where spacers are formed by forming the cover film 23 by photolithography using a grayscale mask. The method can hence reduce the deformation of spacers caused by thermal sagging and achieve a high level of height precision for the spacers, which in turn leads to an increased yield of the display device 2.

In addition, in the present embodiment, the planarization film 21 is formed by photolithography involving a single exposure. The present method can for this reason reduce the cost of the photosensitive resin R when compared with a method where the planarization film 21 is formed by exposing the photosensitive resin R to light twice. The cover film 23 can be easily formed by photolithography using a mask having two different transmittances.

Furthermore, the second flat portion 21b is located farther from the closest contact hole 21c than from the closest opening 23c. Since the contact hole 21c, which is an opening in the planarization film 21, is located farther than is the second flat portion 21b, the second flat portion 21b is less deformed by thermal sagging in the baking step of photolithography. The present method can hence reduce thermal sagging in the baking step than a method where spacers are formed by forming the cover film 23 by photolithography using a grayscale mask.

Additionally, since height H2 is greater than height E1, the planarization film 21 is dominant in the control of the height of the spacers. The present embodiment, where the second flat portion 21b can have increased height precision, can therefore more precisely control the height of the spacers. In addition, in the present embodiment, although the cover film 23 is formed in locations above the second flat portion 21b, height E2 is greater than height E1. The top face of the second cover-film flat portion 23b can therefore be more reliably formed higher than the top face of the first cover-film flat portion 23a.

Embodiment 2

Figure 10:
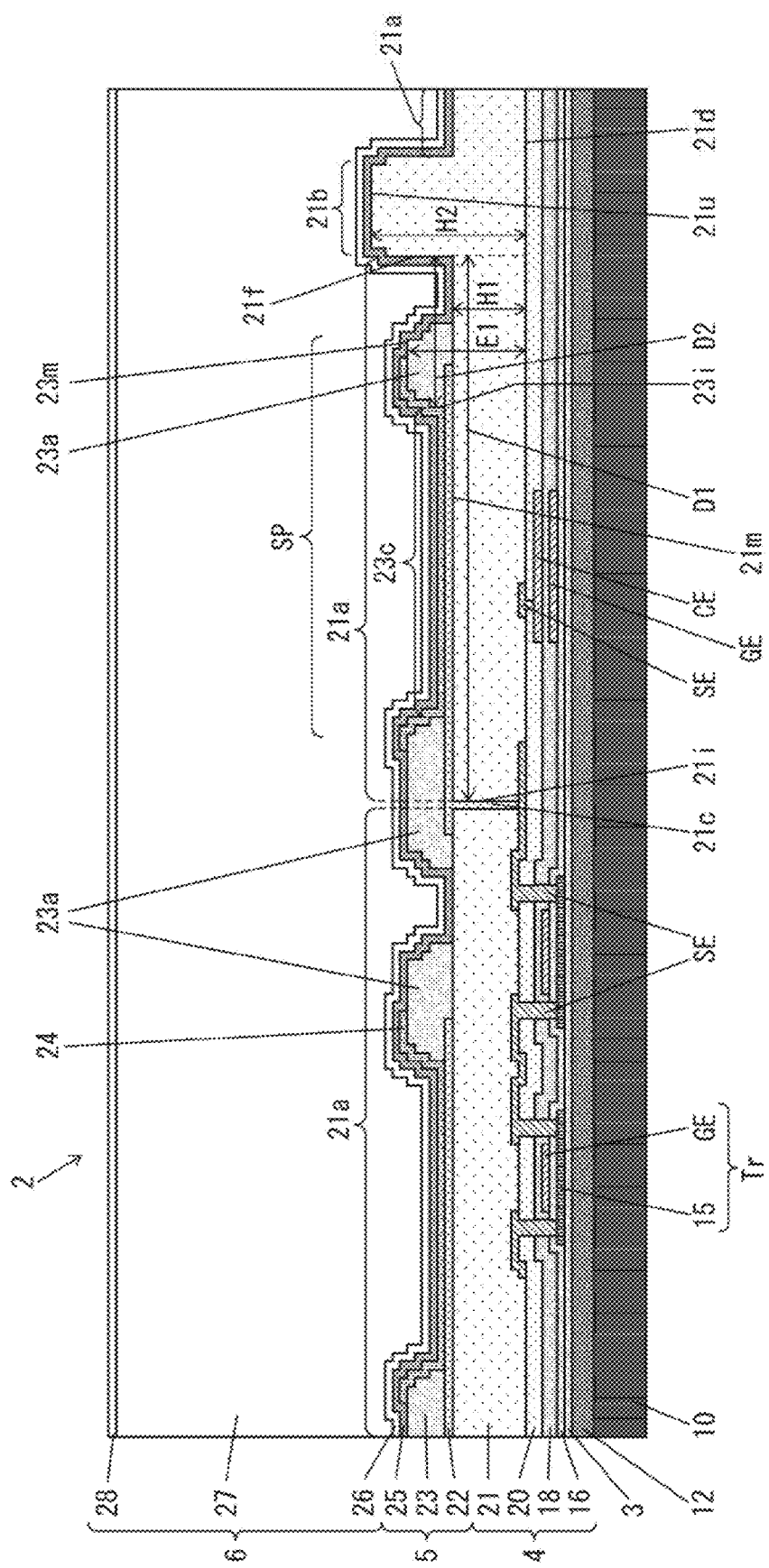
FIG. 10 is a cross-sectional view of a display area of a display device in accordance with Embodiment 2.

FIG. 10 is a cross-sectional view of a display device 2 in accordance with the present embodiment in locations corresponding to FIG. 1. The display device 2 in accordance with the present embodiment has a structure identical to that of the display device 2 in accordance with the previous embodiment, except that the cover film 23 is not formed in locations above the second flat portion 21b in a plan view. Specifically, the display device 2 in accordance with the present embodiment includes, in the display area DA, the cover film 23 only in locations above the first flat portion 21a and the contact holes 21c of the planarization film 21 in a plan view.

Figure 11:
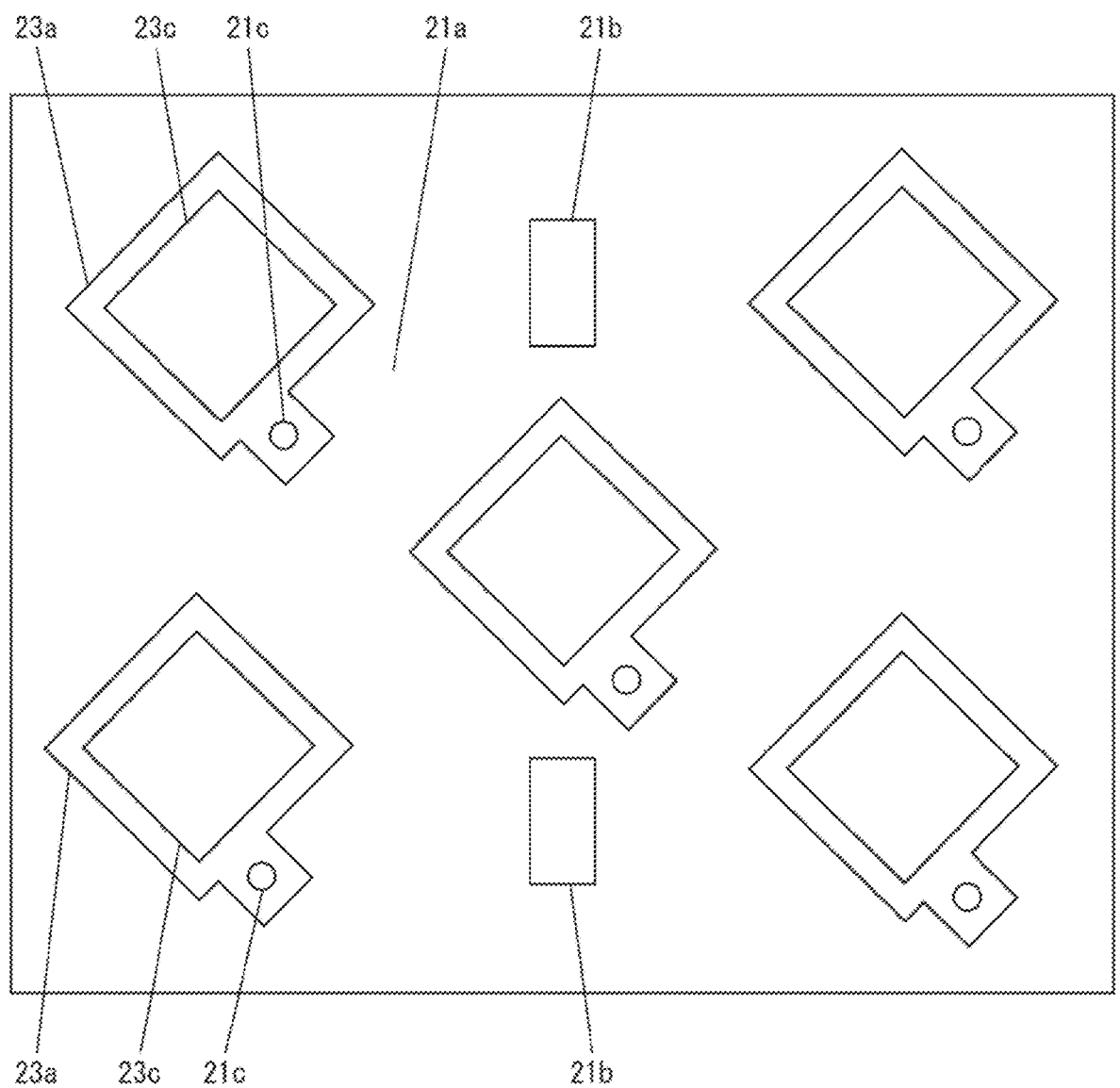
FIG. 11 is a top view illustrating a positional relationship between a planarization film and a cover film in the display device in accordance with Embodiment 2.

FIG. 11 is an enlarged top view illustrating a positional relationship between the planarization film 21 and the cover film 23 in accordance with the present embodiment in locations corresponding to FIG. 3. For convenience of description, FIG. 11 shows the display device 2 by removing the sealing layer 6, the upper electrode 25, and the light-emitting layer 24 that are arranged in this order when viewed from above. FIG. 11 also shows the contact hole 21c by removing the layers above the contact hole 21c where the contact hole 21c is not directly visible from above in a plan view.

The display device 2 in accordance with the present embodiment may be obtained by only changing the aforementioned method of manufacturing the display device 2 in such a manner that the cover film 23 is not formed in locations above the second flat portion 21b in a plan view. In such a case, the light-emitting layer 24 may be formed by vapor deposition using a metal mask abutting the second flat portion 21b.

The cover film 23, in the present embodiment, needs only to be formed so as to cover at least the edges of the pixel electrodes 22 and also to overlap the contact holes 21c in a plan view, as shown in FIGS. 10 and 11. For instance, the cover film 23 may be provided only on the peripheral edges of the pixel electrodes 22 and in frame-shaped locations around the contact holes 21c, as shown in FIG. 11.

In the display device 2 in accordance with the present embodiment, only the second flat portion 21b serves as spacers. The precision of the height of the spacers therefore is not much affected by the deformation of the cover film 23 in performing photolithography on the cover film 23. The present embodiment can therefore more precisely control the height of the spacers.

Embodiment 3

Figure 12:
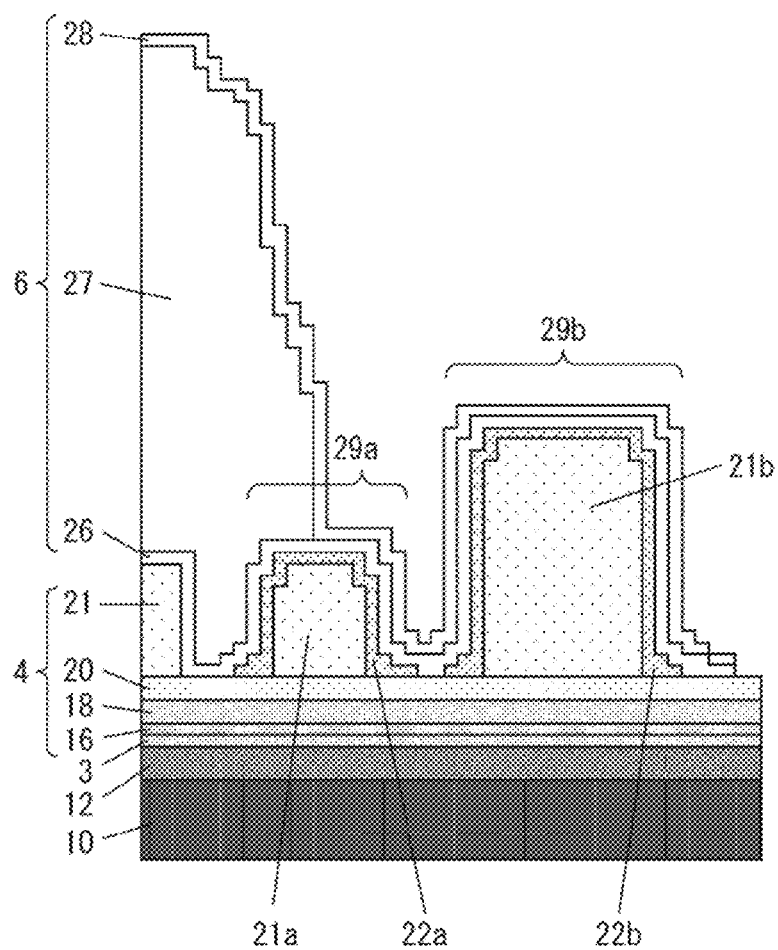
FIG. 12 is a cross-sectional view of a first bank, a second bank, and their surroundings in a frame area of a display device in accordance with Embodiment 3.

FIG. 12 is a cross-sectional view of a display device 2 in accordance with the present embodiment in locations corresponding to FIG. 4. The display device 2 in accordance with the present embodiment has a structure identical to that of the display device 2 in accordance with any of the previous embodiments, except that the first bank 29a and the second bank 29b in the frame area NA include a first metal layer 22a and a second metal layer 22b respectively. In other words, the display device 2 in accordance with the present embodiment includes the first frame-shaped metal layer 22a above the first flat portion 21a of the first bank 29a so as to straddle the first flat portion 21a. Similarly, the display device 2 in accordance with the present embodiment includes the second frame-shaped metal layer 22b above the second flat portion 21b of the second bank 29b so as to straddle the second flat portion 21b.

In the method of manufacturing the display device 2 in accordance with the present embodiment, the same metal material as the metal material for the pixel electrodes 22 is additionally provided in forming the pixel electrodes 22 so as to straddle the first flat portion 21a and the second flat portion 21b in the frame area NA. This arrangement provides the first metal layer 22a and the second metal layer 22b. The first metal layer 22a and the second metal layer 22b are formed independently in the first bank 29a and the second bank 29b respectively as shown in FIG. 12 in the present embodiment. However, the present embodiment is by no means limited to this structure. Alternatively, a metal layer may be formed so as to straddle the first bank 29a and the second bank 29b.

In the display device 2 in accordance with the present embodiment, the first bank 29a and the second bank 29b include the first metal layer 22a and the second metal layer 22b covering the side and top faces of the flat portions of the first bank 29a and the second bank 29b respectively. This structure can reduce the possibility of water reaching the flat portions of the banks, which in turn reduces the possibility of water reaching the light-emitting element layer 5 in the display area DA. Since the possibility is reduced of the light-emitting element layer 5 being degraded by water, the display device 2 becomes more reliable.

It is difficult to form the inorganic layer in the sealing layer 6 at the upper and lower ends of the first bank 29a and the second bank 29b because the inorganic layer is formed by low temperature CVD at 70° C. to 100° C. It is particularly difficult to extend the inorganic layer all the way through to the lower ends of the banks if the inorganic layer in the sealing layer 6 is formed by low temperature CVD.

In the present embodiment, since there is formed a metal layer on the top and side faces of the banks before the inorganic layer is formed, the surface of the inorganic layer reacts uniformly with the metal layer in low temperature CVD. Therefore, in the display device 2 in accordance with the present embodiment, the inorganic layer in the sealing layer 6 can be formed in the first bank 29a and the second bank 29b, advantageously providing good covering of the first bank 29a and the second bank 29b. Furthermore, the metal layer covers as far as the lower ends of the banks, thereby providing improved covering of the banks with the inorganic layer.

Figure 13:
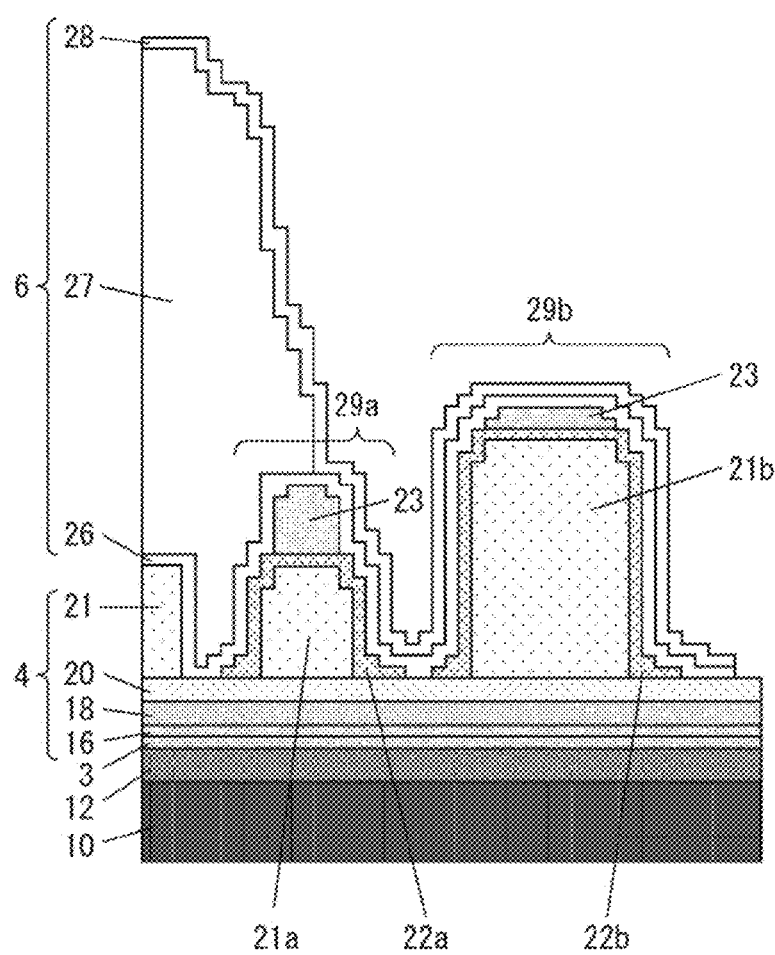
FIG. 13 is a cross-sectional view of a first bank, a second bank, and their surroundings in a frame area of a display device in accordance with a variation example of Embodiment 3.

FIG. 13 is a diagram illustrating a variation example of the display device 2 in accordance with the embodiment shown in FIG. 12. The present variation example has a structure identical to that of the display device 2 of a previous embodiment, except that a frame-shaped cover film 23 is additionally formed above the first metal layer 22a and the second metal layer 22b respectively in the first bank 29a and the second bank 29b in the frame area NA.

The display device 2 in accordance with the present variation example may be manufactured by the same method as the method of manufacturing the display device 2 in accordance with any of the previous embodiments, except only that the frame-shaped cover film 23 is additionally formed above the first metal layer 22a and the second metal layer 22b. The first metal layer 22a and the second metal layer 22b may be formed independently in the first bank 29a and the second bank 29b respectively as shown in FIG. 13 in the present variation example, similarly to Embodiment 3. A metal layer may also be formed so as to straddle the first bank 29a and the second bank 29b, similarly to Embodiment 3.

The display device 2 in accordance with the present variation example allows for higher banks than the display device 2 in accordance with any of the previous embodiments. The display device 2 in accordance with the present variation example can therefore better prevent the organic sealing film 27 in the sealing layer 6 from wet-spreading to the outside.

Figure 14:
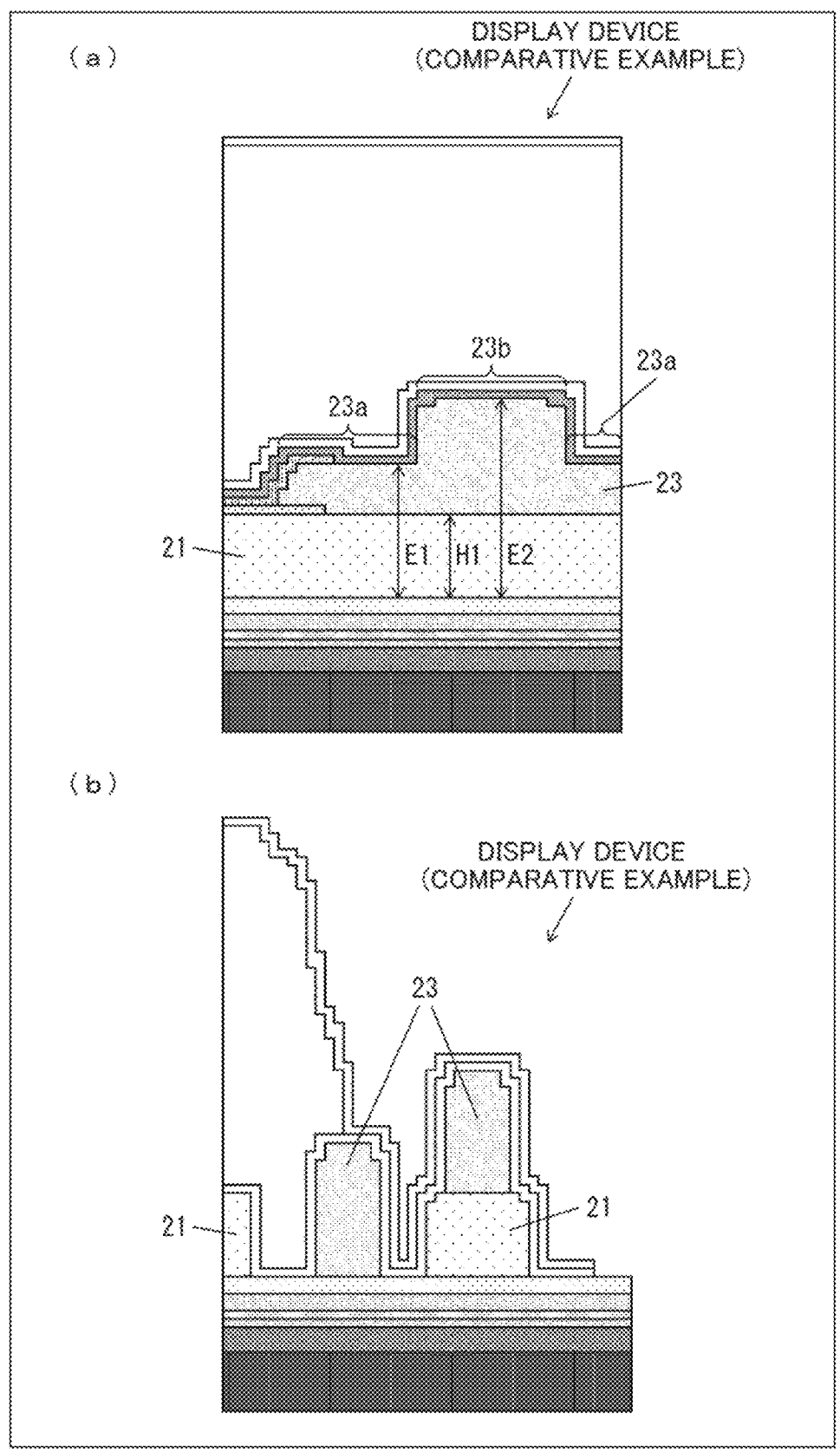
FIG. 14 is a set of cross-sectional views of a first bank, a second bank, and their surroundings in a display area and a frame area of a display device in accordance with a comparative example.

FIG. 14 is a diagram illustrating a display device in accordance with a comparative example of the previous embodiments. Portion (a) of FIG. 14 is an enlarged cross-sectional view of the surroundings of the locations, in the display device in accordance with the comparative example, where spacers are provided in locations corresponding to FIG. 1 or 10. Portion (b) of FIG. 14 is a cross-sectional view of the locations, in the display device in accordance with the comparative example, corresponding to FIG. 4, 12, or 13.

In the display device of the comparative example, the spacers are provided only by the second cover-film flat portion 23b as shown in (a) of FIG. 14. Therefore, if such a cover film 23 is formed by photolithography using a grayscale mask, the second cover-film flat portion 23b thermally sags much in the baking step because the second cover-film flat portion 23b, which can thermally sag, is larger in volume than the aforementioned second flat portion 21b and also because the second cover-film flat portion 23b is closer to the opening 23c.

The cover film 23 therefore deforms much due to the thermal sagging of the second cover-film flat portion 23b, which reduces the precision of the height of the spacers. This in turn leads to a reduced yield of the display device.

The banks do not contain the pixel electrodes 22 in the display device in accordance with the comparative example as shown in (b) of FIG. 14. The structure increases the possibility of water reaching the planarization film 21 or the cover film 23 in the banks. The display device hence becomes less reliable.

Figure 15:
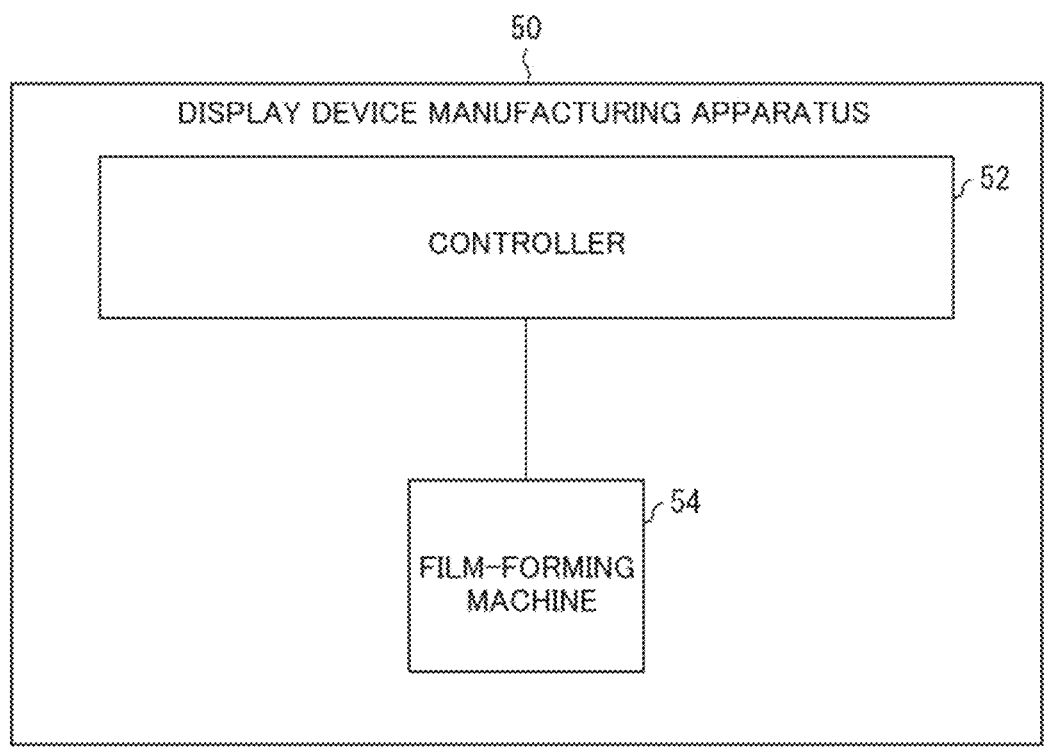
FIG. 15 is a block diagram of a display device manufacturing apparatus in accordance with the embodiments.

FIG. 15 is a block diagram of a display device manufacturing apparatus 50 used in the manufacture of the display device 2 in accordance with any of the previous embodiments.

The display device manufacturing apparatus 50 includes a controller 52 and a film-forming machine 54. The controller 52 may control the film-forming machine 54. The film-forming machine 54 may form various layers in the display device 2.

General Description

Aspect 1 is directed to a display device including a planarization film, first electrodes, edge covers, light-emitting layers, and second electrodes that are arranged in this order when viewed from a substrate side and further including: a display area; a plurality of pixels forming the display area; and a plurality of openings in the edge covers, the first electrodes being exposed in the plurality of openings, wherein the planarization film has first flat portions, second flat portions, and contact holes, the plurality of openings respectively overlap the first flat portions, the second flat portions are located between the plurality of openings, and each edge cover overlapping one of the first flat portions has, on a second electrode side, a surface that has a first height from a bottom surface of the planarization film on the substrate side, and each second flat portion has, on the second electrode side, a surface that has a second height from the bottom surface, the first height being smaller than the second height.

In aspect 2, in the display area, the edge covers are provided only on peripheral edges of the first electrodes and in frame-shaped locations around the contact holes.

In aspect 3, the second flat portions respectively overlap the edge covers, and each edge cover overlapping one of the second flat portions has, on the second electrode side, a surface that has a third height from the bottom surface, the first height being higher than the third height.

In aspect 4, the display device further includes metal wiring layers closer to a substrate than to the planarization film, wherein the first electrodes are respectively in contact with the metal wiring layers in the contact holes.

In aspect 5, the display device further includes: a sealing layer overlying the second electrodes, the sealing layer including a first inorganic sealing film, an organic sealing film, and a second inorganic sealing film that are arranged in this order when viewed from the second electrode side; and a frame-shaped first bank in a frame area, the first bank including the first flat portions, surrounding the display area, and abutting an end of the organic sealing film.

In aspect 6, the first bank includes a frame-shaped first metal layer in a location overlying the first flat portions so as to straddle that first flat portion.

In aspect 7, the display device further includes a frame-shaped bank overlying the first metal layer, the frame-shaped bank containing a same material as the edge covers.

In aspect 8, the display device further includes a frame-shaped second bank including the second flat portions and surrounding the first bank.

In aspect 9, the second bank includes a frame-shaped second metal layer in a location overlying the second flat portions so as to straddle the second flat portions.

In aspect 10, the display device further includes a frame-shaped bank overlying the second metal layer, the frame-shaped bank containing a same material as the edge covers.

In aspect 11, a distance between an outer face of each second flat portion as viewed from a center of that second flat portion and an inner face of an associated one of the contact holes as viewed from a center of that contact hole is greater than a distance between the outer face and an inner face of one of the plurality of openings that is closest to the outer face as viewed from a center of that opening.

Aspect 12 is directed to a method of manufacturing a display device including a planarization film, first electrodes, edge covers, light-emitting layers, and second electrodes that are arranged in this order when viewed from a substrate side and further including: a display area; a plurality of pixels forming the display area; and a plurality of openings in the edge covers, the first electrodes being exposed in the plurality of openings, the method including the planarization film forming step of forming the planarization film by photolithography using a grayscale mask and involving a single exposure, wherein the planarization film forming step forms: first flat portions respectively overlapping the plurality of openings; second flat portions between the plurality of openings; and contact holes, to form the planarization film in such a manner that each edge cover overlapping one of the first flat portions has, on a second electrode side, a surface that has a first height from a bottom surface of the planarization film on the substrate side and that each second flat portion has, on the second electrode side, a surface that has a second height from the bottom surface, the first height being smaller than the second height.

In aspect 13, the planarization film forming step forms the planarization film from a positive photosensitive material, forms the first flat portions in locations corresponding to semi-light-transmitting sections of the grayscale mask, forms the second flat portions in locations corresponding to light-blocking sections of the grayscale mask, and forms the contact holes in locations corresponding to light-transmitting sections of the grayscale mask.

In aspect 14, the method further includes the sealing layer forming step of forming a sealing layer overlying the second electrodes, the sealing layer including a first inorganic sealing film, an organic sealing film, and a second inorganic sealing film that are arranged in this order when viewed from the second electrode side, wherein the planarization film forming step forms a frame-shaped first bank in a frame area surrounding the display area, the first bank including the first flat portions, and the sealing layer forming step causes an end of the organic sealing film to abut the first bank.

In aspect 15, the method further includes the first metal layer forming step of providing a metal material used for the first electrodes in locations overlying the first flat portions in the first bank so as to straddle the first flat portions in coincidence with formation of the first electrodes, to form a frame-shaped first metal layer.

In aspect 16, the method further includes the first bank edge cover forming step of forming a frame-shaped bank overlying the first metal layer in coincidence with formation of the edge covers, the frame-shaped bank containing a same material as the edge covers.

In aspect 17, the planarization film forming step further forms a frame-shaped second bank including the second flat portions and surrounding the first bank.

In aspect 18, the method further includes the second metal layer forming step of providing a metal material used for the first electrodes in locations overlying the second flat portions in the second bank so as to straddle the second flat portions in coincidence with formation of the first electrodes, to form the frame-shaped second metal layer.

In aspect 19, the method further includes the second bank edge cover forming step of forming a frame-shaped bank overlying the second metal layer in coincidence with formation of the edge covers, the frame-shaped bank containing a same material as the edge covers.

In aspect 20, The method further includes the edge cover forming step of forming the edge covers by photolithography using a photomask and involving a single exposure, the photomask including only light-blocking sections and light-transmitting sections.

Aspect 21 is directed to an apparatus for manufacturing a display device including a planarization film, first electrodes, edge covers, light-emitting layers, and second electrodes that are arranged in this order when viewed from a substrate side and further including: a display area; a plurality of pixels forming the display area; and a plurality of openings in the edge covers, the first electrodes being exposed in the plurality of openings, the apparatus including a film-forming machine that forms, in forming the planarization film: first flat portions respectively overlapping the plurality of openings; second flat portions between the plurality of openings; and contact holes, all by photolithography using a grayscale mask and involving a single exposure, in such a manner that each edge cover overlapping one of the first flat portions has, on a second electrode side, a surface that has a first height from a bottom surface of the planarization film on the substrate side and that each second flat portion has, on the second electrode side, a surface that has a second height from the bottom surface, the first height being smaller than the second height.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technological means disclosed in the embodiments.

The invention claimed is:

1. A display device comprising a planarization film, first electrodes, edge covers, light-emitting layers, and second electrodes that are arranged in this order when viewed from a substrate side and further comprising: a display area; a plurality of pixels forming the display area; and a plurality of openings in the edge covers, the first electrodes being exposed in the plurality of openings, wherein in the display area,
   the planarization film has first flat portions, second flat portions, and contact holes,
   the plurality of openings respectively overlap the first flat portions,
   the second flat portions are located between the plurality of openings, and
   each of the edge covers overlapping one of the first flat portions has, on a second electrode side, a surface that has a first height from a bottom surface of the planarization film on the substrate side, and each of the second flat portions has, on the second electrode side, a surface that has a second height from the bottom surface, the first height being smaller than the second height.

2. The display device according to claim 1, wherein in the display area, the edge covers are provided only on peripheral edges of the first electrodes and in frame-shaped locations around the contact holes.

3. The display device according to claim 1, wherein
   the second flat portions respectively overlap the edge covers, and
   each of the edge covers overlapping one of the second flat portions has, on the second electrode side, a surface that has a third height from the bottom surface, the first height being higher than the third height.

4. The display device according to claim 1, further comprising metal wiring layers closer to a substrate than to the planarization film, wherein the first electrodes are respectively in contact with the metal wiring layers in the contact holes.

5. The display device according to claim 1, further comprising:

a sealing layer overlying the second electrodes, the sealing layer including a first inorganic sealing film, an organic sealing film, and a second inorganic sealing film that are arranged in this order when viewed from the second electrode side; and a frame-shaped first bank in a frame area, the first bank including the first flat portions, surrounding the display area, and abutting an end of the organic sealing film.

6. The display device according to claim 5, wherein the first bank includes a frame-shaped first metal layer in a location overlying the first flat portions so as to straddle that first flat portion.

7. The display device according to claim 6, further comprising a frame-shaped bank overlying the first metal layer, the frame-shaped bank containing a same material as the edge covers.

8. The display device according to claim 5, further comprising a frame-shaped second bank including the second flat portions and surrounding the first bank.

9. The display device according to claim 8, wherein the second bank includes a frame-shaped second metal layer in a location overlying the second flat portions so as to straddle the second flat portions.

10. The display device according to claim 9, further comprising a frame-shaped bank overlying the second metal layer, the frame-shaped bank containing a same material as the edge covers.

11. The display device according to claim 1, wherein a distance between an outer face of each of the second flat portions as viewed from a center of that second flat portion and an inner face of an associated one of the contact holes as viewed from a center of that contact hole is greater than a distance between the outer face and an inner face of one of the plurality of openings that is closest to the outer face as viewed from a center of that opening.

12. The display device according to claim 1, wherein the first flat portions and the second flat portions are formed in a same layer and made of a same material.

13. The display device according to claim 12, wherein each of the first flat portions has, on an edge cover side, another surface that has a third height from the bottom surface of the planarization film on the substrate side, and each of the second flat portions has, on the edge cover side, still another surface that has a fourth height from the bottom surface, the third height being smaller than the fourth height.

* * * * *